US006939482B2

(12) United States Patent
Miura et al.

(10) Patent No.: US 6,939,482 B2
(45) Date of Patent: Sep. 6, 2005

(54) PHOSPHOR THIN FILM, MANUFACTURING METHOD OF THE SAME, AND ELECTROLUMINESCENT PANEL

(75) Inventors: Noboru Miura, 8-18,Nishikata 1-chome, Bunkyo-ku, Tokyo (JP); Mitsuhiro Kawanishi, Kawasaki (JP); Yoshihiko Yano, Chuo-ku (JP)

(73) Assignees: TDK Corporation, Tokyo (JP); Noboru Miura, Tokyo (JP)

( * ) Notice: Subject to any disclaimer, the term of this patent is extended or adjusted under 35 U.S.C. 154(b) by 0 days.

(21) Appl. No.: 10/664,923

(22) Filed: Sep. 22, 2003

(65) Prior Publication Data
US 2004/0206935 A1 Oct. 21, 2004

(30) Foreign Application Priority Data

Sep. 20, 2002 (JP) ........................... 2002-274516
Sep. 18, 2003 (JP) ........................... 2003-326736

(51) Int. Cl.$^7$ ............................................... H05B 33/10
(52) U.S. Cl. ................ 252/301.4 S; 252/301.6 S; 313/503; 428/690; 428/917; 427/66; 427/69; 427/70
(58) Field of Search .............. 252/301.4 S, 301.6 S, 252/304.4 R, 301.6 R; 313/503; 427/66, 69, 70; 428/690, 917

(56) References Cited

U.S. PATENT DOCUMENTS 6,042,746 A * 3/2000 Chadha et al. ........ 252/301.4 R 6,252,254 B1 * 6/2001 Soules et al. ................ 257/89

FOREIGN PATENT DOCUMENTS

| JP | A 1-206594 | 8/1989 |
| JP | A 2-51891 | 2/1990 |
| JP | 02-51891 | * 2/1990 |
| JP | A 2-148688 | 6/1990 |
| JP | 02-148688 | * 6/1990 |
| JP | A 5-65478 | 3/1993 |
| JP | A 7-122364 | 5/1995 |
| JP | A 7-258630 | 10/1995 |

OTHER PUBLICATIONS

Ohura et al. "Properties of Red–Color CaS:Eu Thin Film El Device," ITEJ Technical Report, vol. 16, No. 76, Nov. 1992, pp. 7–11, abstract.

* cited by examiner

Primary Examiner—C. Melissa Koslow
(74) Attorney, Agent, or Firm—Oliff & Berridge, PLC

(57) ABSTRACT

A phosphor thin film includes a matrix material expressed by a composition formula $A_x B_y O_w S_z$, and a substance functioning as a luminescence center in the matrix material. In the composition formula, A represents at least one element selected from the group consisting of Mg, Ca, Sr, Ba, and Zn; B represents at least one rare-earth element selected from the group consisting of Sc, Y, La, Ce, Pr, Nd, Pm, Sm, Eu, Gd, Tb, Dy, Ho, Er, Tm, Yb, and Lu; O represents oxygen atoms; and S represents sulfur atoms, respectively. Molar ratios are respectively set as $0<x<5$, $0<y<4$, $0\leq z<8$, and $0\leq w\leq 8$, and $0=z=w$ never holds true.

6 Claims, 8 Drawing Sheets

PHOSPHOR THIN FILM, MANUFACTURING METHOD OF THE SAME, AND ELECTROLUMINESCENT PANEL

BACKGROUND OF THE INVENTION

1. Field of the Invention

The present invention relates to a phosphor thin film, a manufacturing method thereof, and an electroluminescent (EL) panel.

2. Related Background Art

Thin-film EL panels have been actively studied in recent years as light emitting elements for small-size, or large-size and light-weight flat panel display units. An EL panel of a double insulation structure using a thin-film insulation layer is known as an EL panel having a phosphor thin film made of manganese-added zinc sulfide which emits yellow-orange light. A monochrome thin-film EL display unit using the above-described EL panel has been in practical use.

To be more precise, in this EL panel, lower electrodes of a given pattern are formed on a substrate and a first insulating layer is formed on the substrate where these lower electrodes are formed on. Moreover, a phosphor thin film and a second insulating layer are serially formed on this first insulating layer, and upper electrodes are formed in a given pattern on the second insulating layer so as to constitute a matrix circuit together with the lower electrodes. To increase luminance of the phosphor thin film, it is common to anneal the phosphor thin film at a temperature not higher than a strain point of the glass substrate.

Meanwhile, an EL panel with a structure using a ceramic substrate as the substrate and a thick-film dielectric layer as the insulating layer is proposed recently. Moreover, there is also proposed a structure using a high dielectric constant $BaTiO_3$ thin plate as the substrate while forming electrodes on the rear side of the substrate, and thereby using the thin plate as the insulating layer and as the substrate at the same time. Since the ceramics such as alumina or $BaTiO_3$ are used for the substrates in these structures, it is possible to perform high-temperature annealing of the phosphor thin film to increase the luminance. Moreover, since the thick film or the thin-plate dielectric layer is used as the insulating layer, these structures are more resistant to dielectric breakdown and therefore more reliable than the EL panel using the thin film as the insulating layer. Here, it is not always necessary to apply a structure of sandwiching the phosphor thin film between the insulating layers as in the double insulation structure. For the insulating film, it is sufficient if either the thick film or the thin-plate dielectric layer is provided on one side.

In order to apply the display unit using the above-described EL panel to a color display for a personal computer, a television or other display devices, it is essential to colorize the EL panel.

Sulfide phosphor thin film or the like is known as typical phosphor thin films for an EL panel which emit the three primary colors of red, green, or blue light. The thin-film EL panel using the sulfide phosphor thin films has excellent reliability and environmental resistance. As examples of sulfide phosphor thin film, SrS:Ce using SrS as a matrix material (base material) and Ce as a luminescence center, and ZnS:Tm are known as blue light-emitting phosphors. Meanwhile, ZnS:Sm and CaS:Eu are known as red light-emitting phosphors, and ZnS:Tb, CaS:Ce, and the like are known as green light-emitting phosphors. These phosphors are currently under studies.

SUMMARY OF THE INVENTION

However, these phosphor films designed to emit red, green, and blue light do not possess sufficient luminance. Accordingly, a color display unit using an EL panel has not been put to practical use yet.

To be more precise, a phosphor thin film using CaS:Eu is known as a phosphor film for red light, for example. This phosphor emits the light with comparatively high color purity. This phosphor thin film has been further improved by the techniques disclosed in Japanese Unexamined Patent Publications No. 1(1989)-206594, No. 2(1990)-148688, and the like. However, with respect to the red color for a full-color display unit, this phosphor thin film does not have sufficient luminescence characteristics in terms of luminance, efficiency, and the like. Meanwhile, as described in Japanese Unexamined Patent Publication No. 2(1990)-51891 and Technical Report of Institute of Television Engineers of Japan Vol. 16, No. 76, p. 7–11, this phosphor thin film also has a problem that several seconds to several tens of seconds are required as response time. Accordingly, without further modification, this phosphor film is difficult to be applied to a red EL panel for a full-color display unit for moving image which requires real-time response to driving signals.

In the meantime, a method of obtaining red light by extracting the red wavelength band out of an EL spectrum emitted from a ZnS:Mn film, which is a phosphor thin film for orange light with high luminance and high efficiency, by use of a color filter has been also attempted. However, a manufacturing process of an EL display unit including a filter is complicated. Moreover, the biggest problem of this method is that the filter reduces the luminance. To be more precise, the luminance is reduced by 10% to 20% in the process of extracting the red light using the filter. Therefore, this method is difficult to be put to practical use due to the insufficient luminance.

Moreover, as the phosphor thin films for luminescence in various colors, a development of a rare-earth-doped-alkaline-earth thiogallate phosphor ($MGa_2S_4$:RE (M is an alkaline-earth element and RE is cerium (Ce))) (see Japanese Unexamined Patent Publication No. 5(1993)-65478), and a development of a rare-earth-doped alkaline-earth thioaluminate phosphor ($MAl_2S_4$:RE (M is an alkaline-earth element, and RE is cerium (Ce) and europium (Eu))) (see Japanese Patent No.2840185) have been reported in recent years. However, the luminance thereof is practically insufficient.

The present invention has been made in consideration of the foregoing problems. It is an object of the present invention to provide a high-luminance phosphor thin film, a manufacturing method thereof, and an EL panel using the phosphor thin film.

The inventors of the present invention conducted extensive studies and found out that a newly composed phosphor thin film using a complex compound of europium-doped calcium sulfide (CaS:Eu) with addition of yttrium (such as a thioyttrate compound $CaY_2S_4$:Eu) emitted light with considerably higher luminance as compared to the known phosphors, and have thereby reached the present invention.

A phosphor thin film according to the present invention includes a matrix material expressed by a composition formula $A_xB_yO_wS_z$, and a substance functioning as a luminescence center in the matrix material. Here, in the composition formula, A represents at least one element selected from the group consisting of Mg, Ca, Sr, Ba, and Zn; B represents at least one rare-earth element selected from the group consisting of Sc, Y, La, Ce, Pr, Nd, Pm, Sm, Eu, Gd, Tb, Dy, Ho, Er, Tm, Yb, and Lu; O represents oxygen atoms; and S represents sulfur atoms, respectively. Moreover, molar ratios are respectively set as 0<x<5, 0<y<4, 0≦z≦8, and 0≦w≦8, and 0=z=w never holds true.

The luminance of the above-described phosphor thin film becomes sufficiently higher than the known one. A wavelength of the light radiated from the phosphor thin film like this varies depending on the combination of the component A, the component B, and the substance M which functions as the luminescence center.

Here, the substance suitably functioning as the luminescence center may be Mn, Mn compounds, Eu, Eu compounds, Ce, and Ce compounds, for example.

Moreover, it is preferable that the matrix material satisfies 0.001<w/(z+w)<0.6. In this way, the phosphor thin film lasts longer.

A method of manufacturing a phosphor thin film according to the present invention includes: forming a thin film by vapor deposition using a single vapor source including at least one element selected from the group consisting of Mg, Ca, Sr, Ba, and Zn, any of an oxide and a sulfide of at least one element selected from the group consisting of Sc, Y, La, Ce, Pr, Nd, Pm, Sm, Eu, Gd, Tb, Dy, Ho, Er, Tm, Yb, and Lu, and a substance functioning as a luminescence center; and annealing the formed thin film.

According to this method, it is possible to manufacture the above-described phosphor thin film easily without control of individual vapor sources which may be required when using a plurality of vapor sources.

Moreover, an EL panel according to the present invention includes the above-described phosphor thin film.

Since the present invention can provide an EL panel which emits high-luminance light, it is possible to realize a high-performance EL color display unit.

DESCRIPTION OF THE PREFERRED EMBODIMENTS

Figure 1:
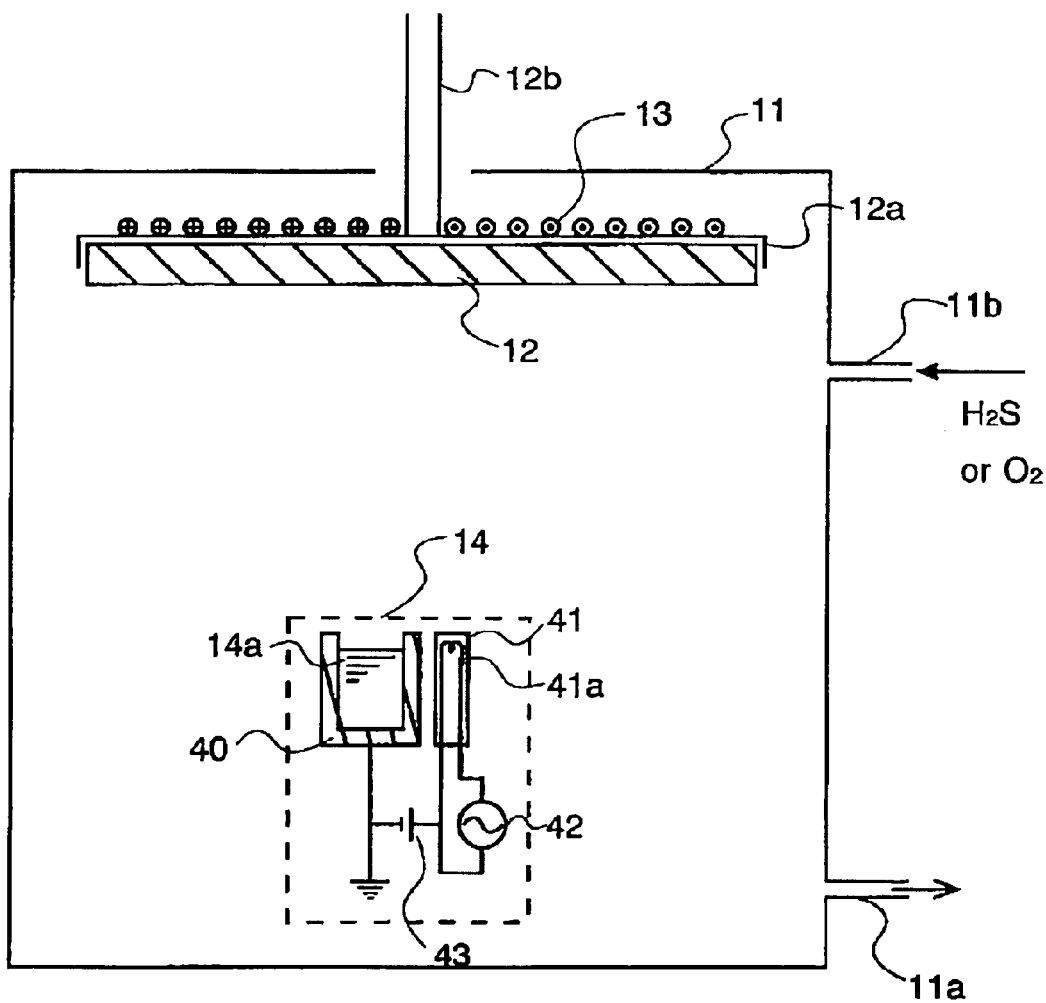
FIG. 1 is a partial cross-sectional view showing a configuration example of an inorganic EL panel using the phosphor thin film according to the embodiment.

Hereinafter, an embodiment of the present invention will be described in detail.

A phosphor thin film of this embodiment is a phosphor thin film expressed by a composition formula $A_xB_yO_wS_z$:M.

In other words, in this phosphor thin film, a substance M functioning as a luminescence center is added to a matrix material expressed by a composition formula $A_xB_yO_wS_z$.

In the above composition formula, the element A is any one element or a combination of two or more elements of the following alkaline-earth element group consisting of magnesium, calcium, strontium, barium, and zinc. The element B is any one element or a combination of two or more elements selected from the following rare-earth element group consisting of scandium, yttrium, lanthanum, cerium, praseodymium, neodymium, promethium, samarium, europium, gadolinium, terbium, dysprosium, holmium, erbium, thulium, ytterbium, and lutetium. Meanwhile, O represents oxygen atoms and S represents sulfur atoms. Moreover, the substance M functioning as the luminescence center is any of the above-mentioned rare-earth element such as Eu or Ce, a transitional metal element such as Mn, and a compound containing any of the foregoing elements.

The x, y, z, and w representing molar ratios of the respective constituent elements of the matrix material are set as 0<x<5, 0<y<4, 0≦z≦8, and 0≦w≦8, and z and w never become simultaneously equal to 0.

The substance M functioning as the luminescence center may be Mn, Mn compounds, Eu, Eu compounds, Ce, and Ce compounds, for example.

The Mn compounds maybe manganese sulfide, manganese oxide, manganese chloride, and manganese fluoride.

The Eu compounds may be europium sulfide, europium oxide, europium chloride, and europium fluoride.

The Ce compounds maybe cerium sulfide, cerium oxide, cerium chloride, and cerium fluoride.

The phosphor thin film having the above-described constitution emits high-luminance light compared to prior art when an electric field is provided.

The x, y, z, and w collectively representing the molar ratios of the respective constituent elements of the matrix material may be more preferably set as 0.5≦x<1.5, 1.5≦y≦2.5, 1.5≦z≦4.5, and 0 5≦w≦4.5.

Moreover, it is satisfactory if the matrix material includes either O or S. However, it is preferable that the matrix material is a sulfide which includes S. In that case, it is more preferable that the S is partially substituted by O, that is, the matrix material includes both S and O. The O (oxygen atoms) increases the life of the phosphor thin film. The quantity of the O in the matrix material is preferably set in a range expressed by 0.001<w/(z+w)<0.6. In this way, the effect of increasing the life is significantly enhanced.

The composition of the phosphor thin film can be confirmed by X-ray fluorescence spectroscopy (XRF), X-ray photoelectron spectroscopy (XPS), transmission electron microscopy-energy dispersive X-ray spectroscopy (TEM-EDS), and the like.

The element A of the matrix material is preferably Sr or Ca.

Moreover, the element B of the matrix material is preferably Y, La, Gd, and the like.

In the present invention, to obtain a phosphor thin film which emits red light, it is preferable to select at least one of Mg, Ca, and Sr as the element A, and to use any of Eu, a Eu compound, Mn, and a Mn compound as the substance M functioning as the luminescence center. Alternatively, it is possible to select at least one of Mg, Ca, and Sr as the element A and to add Ba or Zn thereto. Moreover, the content of the substance M relative to the element A is preferably set in a range from 0.1 to 10 atm %.

In particular, when the phosphor thin film includes Ca as the element A, the phosphor thin film emits red light with suitable color purity in addition to an increase in luminance. Moreover, speed of response is enhanced therein. $Ca_xY_yO_wS_z$:Eu is particularly preferred as the phosphor thin film containing Ca as the element A. More specifically, $CaY_2S_4$:Eu is extremely preferable for obtaining excellent red light emission.

Meanwhile, as the phosphor thin film containing Sr as the element A, $Sr_xY_yO_wS_z$:Eu or $Sr_xY_yO_wS_z$:Mn is preferable, such as $SrY_2S_4$:Eu or $SrY_2S_4$:Mn. Among those, excellent red light emission is obtained from $Sr_xY_yO_wS_z$:Eu or more specifically from $SrY_2S_4$:Eu.

$Mg_xY_yO_wS_z$:Mn, such as $MgY_2S_4$:Mn, is preferred as the phosphor thin film containing Mg as the element A.

To obtain a phosphor which emits green light, it is preferable to use Zn as the element A and to use Mn or a Mn compound as the substance M functioning as the luminescence center. Alternatively, it is possible to use the element A obtained by adding at least one element selected from Mg, Ca, Sr, and Ba to the Zn. Moreover, the content of the substance M relative to the element A is preferably set in a range from 0.1 to 10 atm %. $Zn_xY_yO_wS_z$:Eu is preferred as the phosphor thin film containing Zn as the element A. More specifically, $ZnY_2S_4$:Eu is particularly preferable in terms of luminance and green color purity. Excellent green light emission is obtained from the above-described phosphor thin film.

To obtain a phosphor which emits blue light, it is preferable to use Ba as the element A and to use Mn or a Mn compound as the substance M functioning as the luminescence center. Alternatively, it is possible to use the element A obtained by adding at least one element selected from Mg, Ca, Sr, and Zn to the Ba. Moreover, the content of the substance M relative to the element A is preferably set in a range from 0.1 to 10 atm %. $Ba_xY_yO_wS_z$:Mn is preferred as the phosphor thin film containing Ba as the element A. More specifically, $BaY_2S_4$:Mn is particularly preferable in terms of luminance and blue color purity. Excellent blue light emission can be obtained from the above-described phosphor thin film.

A film thickness of each of the phosphor thin films using the above-described materials is preferably set in a range from 50 nm to 700 nm, more preferably in a range from 100 nm to 300 nm. A driving voltage is raised when the phosphor thin film is too thick. On the contrary, luminescence efficiency is reduced when the phosphor thin film is too thin. Especially, it is possible to obtain a phosphor thin film, more particularly an El panel, which is excellent in both luminance and luminescence efficiency, by setting the film thickness within the above-described range.

The phosphor thin film of the present invention normally exists in a form of a crystalline state. However, the phosphor thin film may also exist in a form of an amorphous state.

Methods such as sputtering or vapor deposition are applicable for obtaining the above-described phosphor thin film, and the following vapor deposition method is particularly preferred. In the following, description will be made on the phosphor thin film having the composition $Ca_1Y_2S_4$:Eu as an example.

First, a mixture of calcium sulfide powder, yttrium sulfide powder, and europium sulfide powder is pressed into a form and then sintered in argon gas or hydrogen sulfide-containing argon gas to obtain a single pellet (a vapor source). Then, a phosphor thin film is formed on a substrate by an electron beam evaporation method, that is, by irradiating an electron beam onto this pellet and thereby evaporating the pellet. Alternatively, when any of $Y_2O_3$:Eu phosphor powder and $Y_2O_2S$:Eu phosphor powder which are widely used for manufacturing cathode-ray tubes is used to form the pellet instead of yttrium sulfide or europium sulfide, it is easily possible to obtain a phosphor thin film of a composition $Ca_1Y_2O_pS_{4-p}$:Eu in which sulfur is partially substituted by oxygen.

It is preferable to introduce $H_2S$ gas into a vacuum chamber of an electron beam evaporation apparatus. Here, the $H_2S$ gas is used for avoiding a shortage of sulfur in the fabricated phosphor thin film and to promote a reaction of sulfur with the evaporating materials.

After obtaining the $Ca_1Y_2S_4$:Eu phosphor thin film as described above, it is preferable to anneal the phosphor thin film either in a reducing atmosphere such as nitrogen, argon or vacuum, or in an oxidizing atmosphere such as oxygen or air. As a condition of annealing, it is preferable to conduct annealing in a temperature range from 500 C.° to 100 C.°, or preferably in a range from 600 C.° to 800 C.°. Annealing in the oxidizing atmosphere is effective in the case of synthesizing the phosphor thin film of the above-described composition in which sulfur is partially substituted by oxygen. In this way, sulfur in the phosphor thin film is partially substituted by oxygen.

Regarding the Eu to be added to the matrix material so as to function as the luminescence center, it is possible to add the Eu in a form of metal, a fluoride or an oxide to the pellet instead of a sulfide. The amount of addition varies depending on the raw materials in the pellet or the composition of the phosphor thin film to be formed. Accordingly, the composition of the raw materials should be adjusted to establish the appropriate amount of addition.

The temperature of the substrate during vapor deposition is set in a range from a room temperature to 600 C.°, preferably in a range from 150 C.° to 500 C.°. When the temperature of the substrate is too high, unevenness on the surface of the phosphor thin film is increased and pinholes are generated in the phosphor thin film. Accordingly, a problem of a leak current may occur in the EL panel. Otherwise, the phosphor thin film may turn brownish. Therefore, it is preferable to set the temperature range as described above.

The pressure during vapor deposition is preferably set in a range from $1.33 \times 10^{-4}$ to $1.33 \times 10^{-1}$ Pa ($1 \times 10^{-6}$ to $1 \times 10^{-3}$ Torr). Meanwhile, in the case of introducing the gas such as $H_2S$, it is recommended to adjust the pressure in the range from $6.65 \times 10^{-3}$ to $6.65 \times 10^{-2}$ Pa ($5 \times 10^{-5}$ to $5 \times 10^{-4}$ Torr). Operation of an electron gun becomes unstable when the pressure exceeds the above-described range, and composition control thereby becomes extremely difficult. Although an amount of the gas to be introduced depends on the performance of a vacuum system, it is preferably set in a range from 5 to 200 SCCM, or more preferably in a range from 10 to 30 SCCM.

Meanwhile, it is also possible to move or rotate the substrate during vapor deposition if necessary. The composition of the phosphor thin film is made uniform by moving or rotating the substrate, and unevenness in distribution of the film thickness is reduced accordingly.

When rotating the substrate, revolution speed of the substrate is preferably set to not less than 10 rpm, or more preferably in a range from 10 to 50 rpm, or even more preferably in a range from 10 to 30 rpm. When the revolution speed of the substrate is too fast, a sealing performance of the vacuum chamber tends to decline. On the contrary, when the revolution speed of the substrate is too slow, compositional inhomogeneity in the film thickness direction of the phosphor thin film arises, or the film thickness becomes uneven. Accordingly, the characteristics of the fabricated phosphor thin film are deteriorated. Rotating means for rotating the substrate may be configured as a known rotation mechanism, which includes: a power source such as a motor or a hydraulic rotation mechanism; and a power-transmission and/or speed-reduction mechanism which is a combination of gears, belts, pulleys, and the like.

Heating means for heating the pellet and the substrate only needs to provide given heat capacity, response, and the like. For example, the heating means may be a tantalum wire heater, a sheath heater, a carbon heater, and the like. A heating temperature provided by the heating means is preferably set in a range from 100 C.° to 1400 C.°. Accuracy of temperature control is preferably set in a range of ±1 C.° deviation from 1000 C.°, or more preferably in a range of ±0.5 C.° deviation therefrom.

The formed phosphor thin film such as $Ca_1Y_2S_4$:Eu is preferred to be a thin film of high crystallinity. Evaluation of a degree of crystallinity can be achieved by means of X-ray diffraction, for example. To improve the crystallinity, it is preferable to raise the temperature of the substrate as high as possible during formation of the phosphor thin film. Meanwhile, annealing of the phosphor thin film after formation of the thin film in vacuum, in the atmosphere of $N_2$, Ar, S vapor, $H_2S$ or the like is also effective in light of improving the crystallinity. In particular, when the phosphor thin film being a sulfide is obtained according to the above-described method and then the phosphor thin film is subjected to annealing in the oxidizing atmosphere, it is possible to obtain the phosphor thin film which emits high-luminance light and has a long product life.

FIG. 1 shows a configuration example of an apparatus for forming the phosphor thin film as a light-emitting layer of the present invention. In this example, description will be made on a method of fabricating the phosphor thin film, in which a compound pellet containing barium sulfide and yttrium sulfide with addition of Eu as the material functioning as the luminescence center is used as the vapor source, and $H_2S$ is introduced in the meantime. In FIG. 1, a substrate 12 which is subject to formation of the phosphor thin film as the light-emitting layer thereon, and an electron beam (EB) vapor source 14 are disposed inside a vacuum chamber 11.

The EB vapor source 14 includes a crucible 40 for housing a pellet 14a with addition of the material functioning as the luminescence center, and an electron gun 41 incorporating a filament 41a for electron emission. Reference numerals 10 and 42 are AC powers. Reference numeral 43 is a DC power.

Here in the illustrated example, for the purpose of facilitating the explanation, the location of the vapor source 14 may seem to deviate from a mean position with respect to the substrate. However, in reality, the vapor source 14 is disposed in an appropriate position so as to effectuate uniform composition and film thickness of the phosphor thin film to be deposited.

The vacuum chamber 11 includes an exhaust port 11a, so that the inside of the vacuum chamber 11 can be set to a desired degree of vacuum by exhausting gas from this exhaust port 11a. This vacuum chamber 11 also includes a material gas inlet port 11b for introduction of gas such as hydrogen sulfide.

The substrate 12 is fixed to a substrate holder 12a. A fixed shaft 12b of this substrate holder 12a is fixed by unillustrated rotating shaft fixing means such that the fixed shaft 12b is rotated freely by manipulation from outside while maintaining the degree of vacuum in the vacuum chamber 11. Accordingly, unillustrated rotating means can freely rotate the substrate 12 at desired revolution speed as appropriate. Meanwhile, heating means 13 which includes heater wires and the like is closely attached and fixed to the substrate holder 12a so as to heat and maintain the substrate 12 at a desired temperature.

Using the above-described apparatus, the material evaporated from the EB vapor source 14 is deposited and bonded on the substrate 12, and the phosphor thin film such as Eu-doped calcium yttrate is thereby formed. In this process, it is possible to render the composition and film thickness distribution of the deposited phosphor thin film more uniform by rotating the substrate 12 as appropriate.

Figure 2:
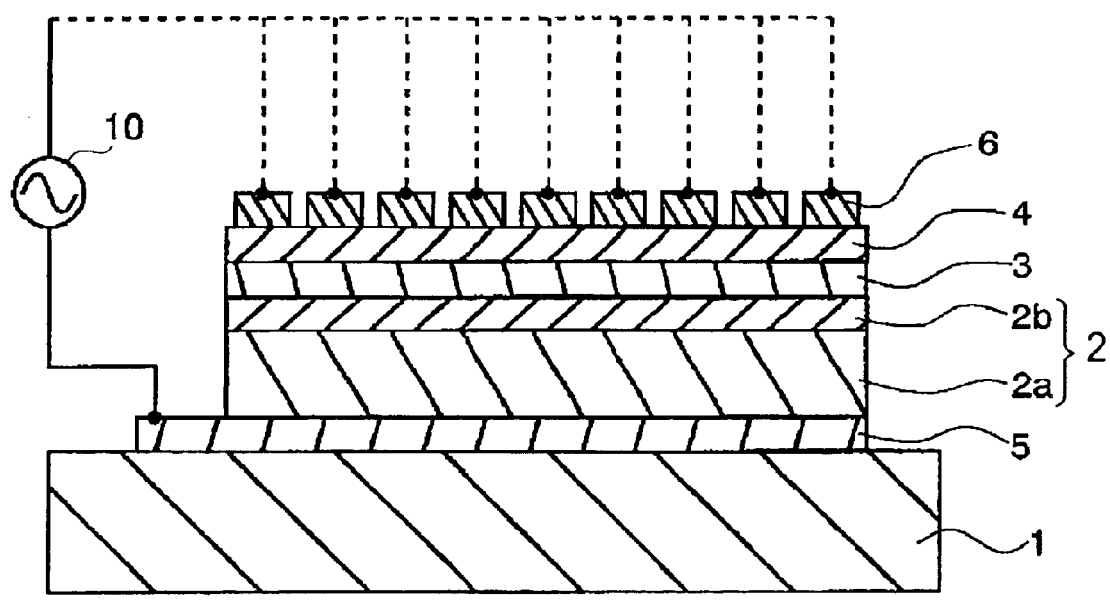
FIG. 2 is a schematic cross-sectional view showing a configuration example of an apparatus for forming a phosphor thin film of an embodiment of the present invention.

To obtain an inorganic EL panel by use of the phosphor thin film of the present invention, it is possible to adopt a structure as shown in FIG. 2, for example.

FIG. 2 is a partial cross-sectional view showing a configuration example of an inorganic EL panel using the phosphor thin film according to the present invention. In FIG. 2, lower electrodes 5 are formed in a striped pattern on a substrate 1, and a lower insulating layer 2 being a dielectric is formed on the lower electrodes 5. Moreover, a phosphor thin film 3 as a light-emitting layer, and a thin-film insulating layer 4 being a dielectric are serially formed on this lower insulating layer 2. Upper electrodes 6 having a striped pattern which is orthogonal to the lower electrodes 5 are formed on the thin-film insulating layer 4 so that the lower electrodes 5 and the upper electrodes 6 collectively constitute a matrix circuit. Reference numerals 10 and 42 are AC powers. Reference numeral 43 is a DC power.

The lower insulating layer 2 includes a thick-film insulating layer 2a which is a thick-film dielectric, and an insulating layer 2b which is formed by a solution coating and baking method such as a sol-gel method or a MOD method as a planarization layer for planarizing a surface of this thick-film insulating layer 2a. By the way, actuation is possible without the insulating layer 2b in the lower insulating layer 2. In this case, it is preferable to polish the surface of the thick-film insulating layer 2a for the purpose of planarization.

Meanwhile, intermediate layers such as a layer for enhancing adhesion, a layer for relaxing stress, or a barrier layer for preventing a reaction may be provided at respective interfaces of the substrate 1, the lower electrodes 5, the upper electrodes 6, the thick-film insulating layer 2a, the insulating layer 2b, and the thin-film insulating layer 4.

Particularly, it is preferable to provide a $BaTiO_3$ thin-film layer between the insulating layer 2b and the phosphor thin film 3 as a barrier layer. Moreover, if necessary, $BaTiO_3$ thin-film layers may be also provided at the respective interfaces of the substrate 1, the lower electrodes 5, the upper electrodes 6, the thick-film insulating layer 2a, the insulating layer 2b, and the thin-film insulating layer 4.

Furthermore, it is preferable to sandwich the phosphor thin film 3 between ZnS thin films. In this way, a charge injection characteristics and a withstand voltage characteristics of the phosphor thin film are enhanced, and a higher-luminance EL element can be obtained. A film thickness of the ZnS thin film is preferably set in a range from 30 nm to 400 nm, or more preferably in a range from 100 to 300 nm.

In other words, the EL panel preferably adopts the structure of "ZnS thin film/phosphor thin film/ZnS thin film". Alternatively, the EL panel can adopt a structure of alternately stacking the ZnS thin films and the phosphor thin films such as "ZnS thin film/phosphor thin film/ZnS thin film/ . . . /phosphor thin film/ZnS thin film" while disposing the ZnS thin film as the outermost layer.

Meanwhile, the inorganic EL panel may adopt a structure in which the thick-film insulating layer $2a$ is excluded and the phosphor thin film 3 is formed in a laminated structure sandwiched between a pair of thin-film dielectrics such as barium tantalate and provided with thin-film electrodes on both ends thereof, for example.

The material to be used as the substrate is not particularly limited as long as the material is one which is capable of withstanding a temperature for forming the thick-film insulating layer $2a$, a temperature for forming the insulating layer $2b$ and the thin-film insulating layer 4, a temperature for forming the phosphor thin film 3, and a temperature for annealing the phosphor thin film 3, and which is also capable of maintaining given strength. When the thick-film insulating layer $2a$ is applied, the substrate used therein should have a melting point of 600 C.° or more, preferably 700 C.° or more, and particularly a heat resistance temperature of 800 C.° or more. To be more precise, the substrate may be a glass substrate, a ceramic substrate such as alumina ($Al_2O_3$), forsterite ($2MgO.SiO_2$), steatite ($MgO.SiO_2$), mullite ($3Al_2O_3.2SiO_2$), beryllia (BeO), aluminum nitride (AlN), silicon nitride (SiN) or silicon carbide (SiC+BeO), and a heat-resistant glass substrate such as a crystallized glass. Among those materials, an alumina substrate and a crystallized glass substrate are preferred. Meanwhile, beryllia, aluminum nitride, silicon carbide, and the like are preferred when heat conductivity is required.

In addition, it is also possible to use fused silica, a thermally oxidized silicon wafer, and a metal substrate such as titanium, stainless steel, Inconel (trademark), iron, and the like. When using an electrically conductive substrate such as metal, it is preferable to adopt a structure in which a thick film containing an electrode inside is formed on the substrate.

Publicly-known thick-film dielectric materials can be used as the material for the thick-film insulating layer $2a$. Here, it is more preferable to use a material having a relatively high dielectric constant.

For example, it is possible to use lead titanate materials, lead niobate materials, barium titanate materials, for example.

Resistivity of the thick-film insulating layer $2a$ is preferably set to $10^8$ Ω·cm or more, particularly in a range from about $10^{10}$ to $10^{18}$ Ω·cm. Moreover, the thick-film insulating layer $2a$ is preferred to be a substance having relatively high dielectric constant, wherein the dielectric constant $\epsilon$ is preferably defined as $\epsilon=100$ to 1000 or thereabout. A film thickness of the thick-film insulating layer $2a$ is preferably set in a range from 5 to 50 μm, more preferably in a range from 10 to 30 μm.

A method of forming the thick-film insulating layer $2a$ is not particularly limited as long as the film of the thickness of 10 to 50 μm can be obtained relatively easily by the method. For example, a sol-gel method, a printing and baking method, and the like are preferred.

In the case of the printing and baking method, firstly, grain sizes of the materials are properly made uniform and the materials are mixed with a binder to prepare a paste having appropriate viscosity. Subsequently, this paste is applied on the substrate by screen printing and is then dried. Thereafter, this green sheet is baked at an appropriate temperature to obtain the thick-film insulating film $2a$.

The material for constituting the thin-film insulating layer 4 may be barium tantalate ($BaTa_2O_6$), silicon oxide ($SiO_2$), silicon nitride (SiN), tantalum oxide ($Ta_2O_5$), strontium titanate ($SrTiO_3$), yttrium oxide ($Y_2O_3$), barium titanate ($BaTiO_3$), leadtinanate ($PbTiO_3$), PZT, zirconia ($ZrO_2$), siliconoxynitride (SiON), alumina ($Al_2O_3$), leadniobate, PMN-PT materials, and multilayer or mixed thin films thereof, for example. As the method of forming the thin-film insulating layer 4 with these materials, it is possible to apply a known method such as a vapor deposition method, a sputtering method, a CVD method, a sol-gel method or a printing and baking method. A film thickness of the thin-film insulating layer 4 in this case is preferably set in a range from 50 to 1000 nm, or more preferably in a range from about 100 to 500 nm.

The lower electrodes 5 are formed at least on the substrate 1 or inside the thick-film insulating layer $2a$. As the lower electrodes 5 which are exposed to a high temperature when the thick-film insulating layer $2a$ is formed and the phosphor thin film is treated with heat, it is possible to apply generally used metal electrodes containing one element or a combination of two or more elements such as palladium, rhodium, iridium, rhenium, lutetium, platinum, tantalum, nickel, chromium, titanium as principal components. In the case of an EL element configured to sandwich the phosphor thin film 3 between a pair of thin-film dielectrics instead of using the thick-film insulating layer $2a$, it is possible to apply transparent electrodes such as ZnO or ITO as the lower electrodes 5.

Normally, as for the upper electrodes 6, it is preferable to apply transparent electrode having translucency at a given luminescence wavelength band so as to extract the luminescence from the opposite side to the substrate. Here, when the substrate 1 and the thick-film insulating layer 2 possess translucency, it is possible to form the lower electrodes 5 as transparent electrode so as to extract the luminescence from the substrate 1 side.

It is particularly preferable to use ZnO, ITO and the like as the transparent electrode. Whereas ITO usually contains a stoichiometric composition of $In_2O_3$ and SnO, the O amount may be slightly deviated therefrom. A mixture ratio of $SnO_2$ with respect to $In_2O_3$ is preferably set in a range from 1 to 20 wt %, or more preferably in a range from 5 to 12 wt %. Moreover, a mixture ratio of ZnO with respect to $In_2O_3$ in IZO is normally set in a range from 12 to 32 wt %.

Moreover, these electrodes may contain silicon. Such a silicon electrode layer may be made of polycrystalline silicon (p-Si), amorphous silicon (a-Si), or single-crystal silicon if necessary.

In the case of an electrode containing silicon, a substance for securing electric conductivity is doped to principal component silicon. A dopant used as the substance is only required to secure given electric conductivity. Accordingly, it is possible to use dopants which are normally used in silicon semiconductors. To be more precise, the dopant may be B, P, As, Sb, Al, and the like. Among those, B, P, As, Sb, and Al are particularly preferable. A concentration of the dopant is preferably set in a range from about 0.001 to 5 atm %.

As the method of forming the electrode layers with these materials, it is possible to apply a known method such as the vapor deposition method, the sputtering method, the CVD method, the sol-gel method or the printing and baking method. However, particularly when fabricating a structure in which the thick-film insulating layer $2a$ having the lower electrodes 5 inside is formed onto the substrate 1, it is preferable to form the electrode layer by the same method which is applied upon formation of the thick-film insulating layer 2a.

Preferred resistivity of the lower and upper electrodes 4 and 5 is preferably set to 1 Ω·cm or less, more particularly in a range from 0.003 to 0.1 Ω·cm, so as to provide electric fields efficiently to the light-emitting layer 3. Although a film thickness of each of the electrode layers depend on the material subject to formation, the film thickness is preferably set in a range from 50 to 2000 nm, or more preferably in a range from 100 to 1000 nm.

Description has been made on the EL panel applying the $Ca_1Y_2S_4$:Eu phosphor thin film. However, in the present invention, the element A is not limited to Ca but may be at least one element or a combination of two or more elements among Mg, Ca, Sr, Ba, and Zn. Similarly, the element B is not limited to Y but may be at least one element or a combination of two or more elements among the above-described rare-earth elements.

Here, when using the element other than Ca, among Mg, Sr, Ba or Zn as the element A, a pellet containing a sulfide or an oxide of any of these elements may be used appropriately. Similarly, when using any of the rare-earth elements other than Y as the element B, a pellet containing a sulfide or an oxide of the rare-earth element other than Y may be used.

Moreover, the substance functioning as the luminescence center is not limited to Eu. It is possible to use a Eu compound, Ce, a Ce compound, Mn or a Mn compound instead of Eu. In such a case as well, a pellet containing the above metals, an oxide or a sulfide of these metals may be used.

Furthermore, it is possible to fabricate a phosphor thin film of which the matrix material does not contain sulfur, or in other words to fabricate a phosphor thin film satisfying z=0, by canceling introduction of the $H_2S$ gas into the vacuum chamber of the electron beam evaporation apparatus and canceling introduction of the $H_2S$ gas during the annealing process. In this case, when the phosphor thin film is $CaY_2O_4$:Eu, for example, it is possible to apply electron beam vapor deposition using a pellet containing CaO, $Y_2O_3$, $Eu_2O_3$, and the like, or a dual source vapor deposition method using a mixed pellet containing CaO and $Y_2O_3$ and a pellet containing $Eu_2O_3$.

Eventually, it is possible to obtain a full-color EL panel by arranging the phosphor thin films corresponding to three colors of RGB appropriately in the light-emitting layer 3 of the above-described EL panel.

The above-described EL panel can be applied to a full-color panel mainly for a display unit, a multicolor panel, and a partially color panel configured to partially display the three colors.

EXAMPLES

Hereinafter, the present invention will be described further in detail based on concrete examples.

Example 1

An EL panel (an EL element) using the phosphor thin film of the present invention was fabricated. An ITO transparent electrode was formed on a glass substrate of a thickness of 100 nm by a sputtering method, and then a barium tantalate thin-film dielectric was formed thereon of a thickness of 300 nm by the sputtering method. Then, a structure of "EL thin film/barium tantalate thin film (200 nm)" was fabricated thereon. The EL thin film was formed into a structure of "ZnS film (200 nm)/phosphor thin film (300 nm)/ZnS film (200 nm)".

The following electron beam vapor deposition method was used for fabricating the phosphor thin film.

An EB source housing a $Ca_1Y_2S_4$ pellet with addition of Eu by 0.5 mol % was placed in a vacuum chamber where $H_2S$ gas was introduced. The pellet was evaporated from this source at a given evaporation rate, and the phosphor thin film was formed on the rotating substrate which was heated to 400 C.°. The evaporation rate of the vapor source was adjusted such that the film to be formed on the substrate grew in a deposition rate of 1 nm/sec. In this process, $H_2S$ gas was introduced in a flow rate of 20 SCCM. The phosphor thin film was thereby obtained.

In this way, a laminated material having a structure of "$BaTa_2O_6$ film (200 nm)/ZnS film (200 nm)/phosphor thin film (400 nm)/ZnS film (200 nm)/$BaTa_2O6$ film (300 nm)/transparent electrode (100 nm)/substrate" was obtained. Thereafter, the laminated material was annealed in argon gas at 700 C.° for 10 minutes.

Moreover, an ITO transparent electrode of a film thickness of 200 nm was formed on the obtained laminated material at a substrate temperature of 250 C.° by an RF magnetron sputtering method using an ITO oxide target, and the EL panel was finished.

Figure 3:
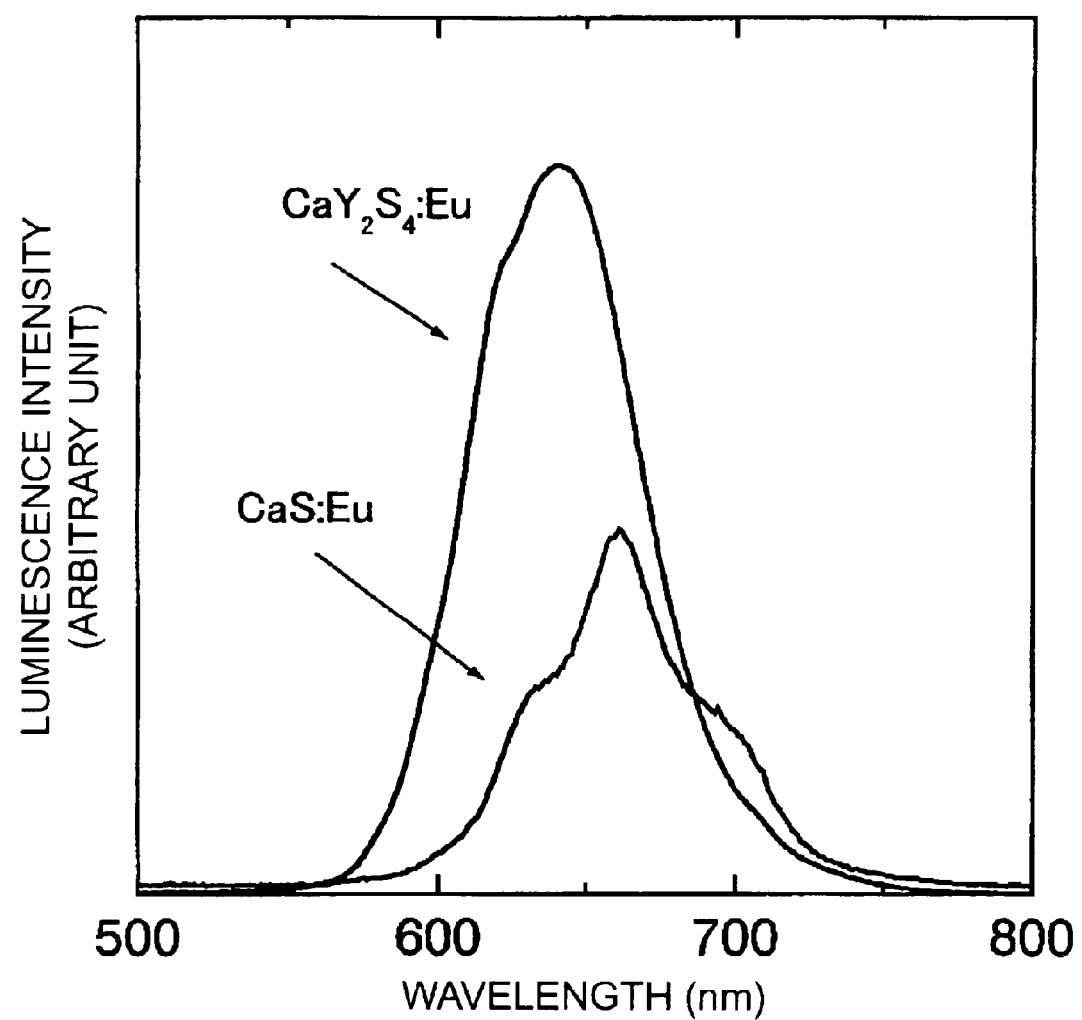
FIG. 3 is a graph showing luminescence emission spectrum of an EL panel of Example 1 and of an EL panel of Comparative Example 1.
Figure 4:
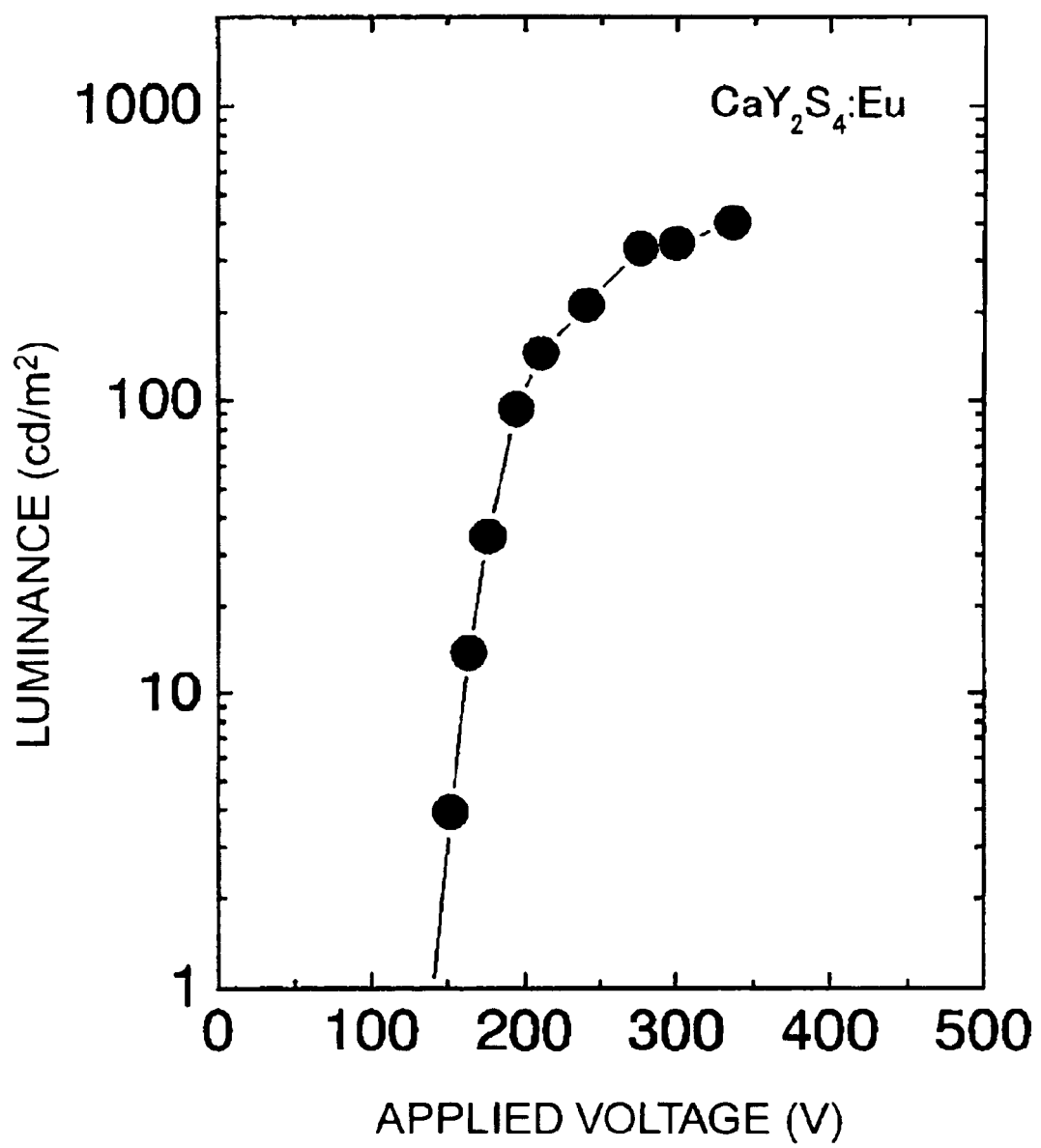
FIG. 4 is a graph showing L-V characteristics of the EL panel of Example 1.

An electric field at a frequency of 1 kHz and a pulse width of 50 $\mu S$ was applied between two electrodes of the obtained EL panel. As a result, red light emission luminance with excellent reproducibility was obtained at an NTSC level equivalent to 400 cd/m² and a chromaticity of (0.67, 0.33) according to the CIE 1931 color matching function. In this EL panel, response time from application of a voltage to stable luminescence was improved to 20 ms or less, as compared to several seconds to several tens of seconds in a conventional example. FIG. 3 shows a luminescence spectrum of this EL panel and FIG. 4 shows an L-V characteristic thereof. It is apparent that the EL panel of this example exerts higher luminance as compared to the conventional example.

Additionally, the composition of the phosphor thin film was investigated by using X-ray fluorescence spectroscopy. As a result, molar ratios of the respective elements therein were Ca:Y:S:Eu=10.36:29.24:43.49:0.57.

Comparative Example 1

An EL panel was obtained as similar to Example 1 except that the phosphor thin film was made of CaS:Eu which had been conventionally deemed excellent as a red EL material. The luminance of the obtained EL panel was about 80 cd/M² when driven at 1 kHz. Moreover, response time from application of a voltage to stable luminescence took several seconds to several tens of seconds. Accordingly, this EL panel required improvements in terms of higher luminance and higher response to be applied to a color display. FIG. 3 shows a luminescence spectrum of this EL panel.

Example 2

Figure 5:
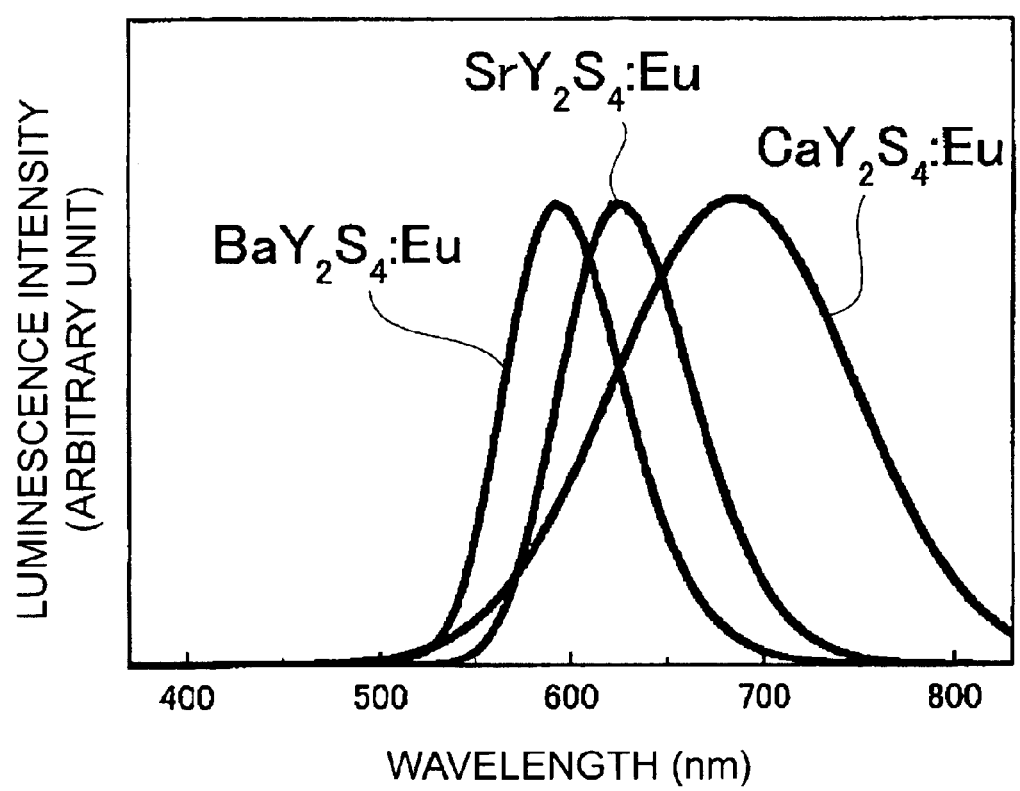
FIG. 5 is a graph showing PL spectrum of EL panels of Example 2 applying Eu as a luminescence center and of the EL panel of Example 1.
Figure 6:
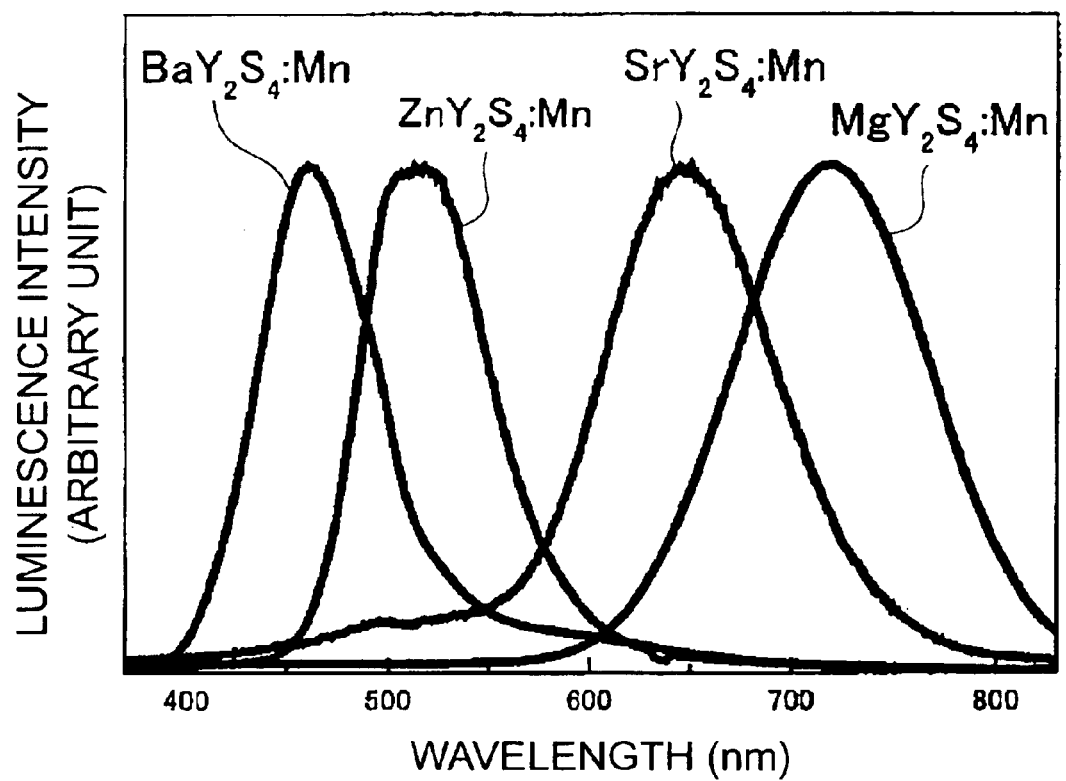
FIG. 6 is a graph showing PL spectrum of EL panels of Example 2 applying Mn as a luminescence center.

Various EL panels were fabricated as similar to Example 1 except that the material for the phosphor thin film was changed from $Ca_1Y_2S_4$:Eu to various yttrate phosphors. To be more precise, the respective yttrate phosphors of $Ba_1Y_2S_4$:Eu, $Sr_1Y_2S_4$:Eu, $Ba_1Y_2S_4$:Mn, $Sr_1Y_2S_4$:Mn, $Mg_1Y_2S_4$:Mn, and $Zn_1Y_2S_4$:Mn were applied. Table 1 shows luminescence peak wavelengths and chromaticity coordinates according to the CIE 1931 color matching function of the EL panels using the above-mentioned thioyttrate phosphors. Here, the luminescence peak wavelengths and the chromaticity coordinates were calculated from photo luminescence (PL) spectra. Results of measurement of the PL spectra of the respective phosphor thin films are shown in FIGS. 5 and 6.

TABLE 1

| Phosphor material | Luminescence peak wavelength (nm) | Chromaticity coordinates |
|---|---|---|
| $BaY_2S_4$:Eu | 592 | (0.555, 0.440) |
| $SrY_2S_4$:Eu | 624 | (0.636, 0.361) |
| $BaY_2S_4$:Mn | 460 | (0.172, 0.157) |
| $SrY_2S_4$:Mn | 650 | (0.565, 0.373) |
| $MgY_2S_4$:Mn | 716 | (0.556, 0.374) |
| $ZnY_2S_4$:Mn | 518 | (0.228, 0.565) |
| $CaY_2S_4$:Eu | 682 | (0.612, 0.382) |

Each of these EL panels emitted high-luminance light which was almost equivalent to Example 1. Among those, the luminance of $Sr_1Y_2S_4$:Eu was significantly high at 700 cd/M$^2$.

Figure 7:
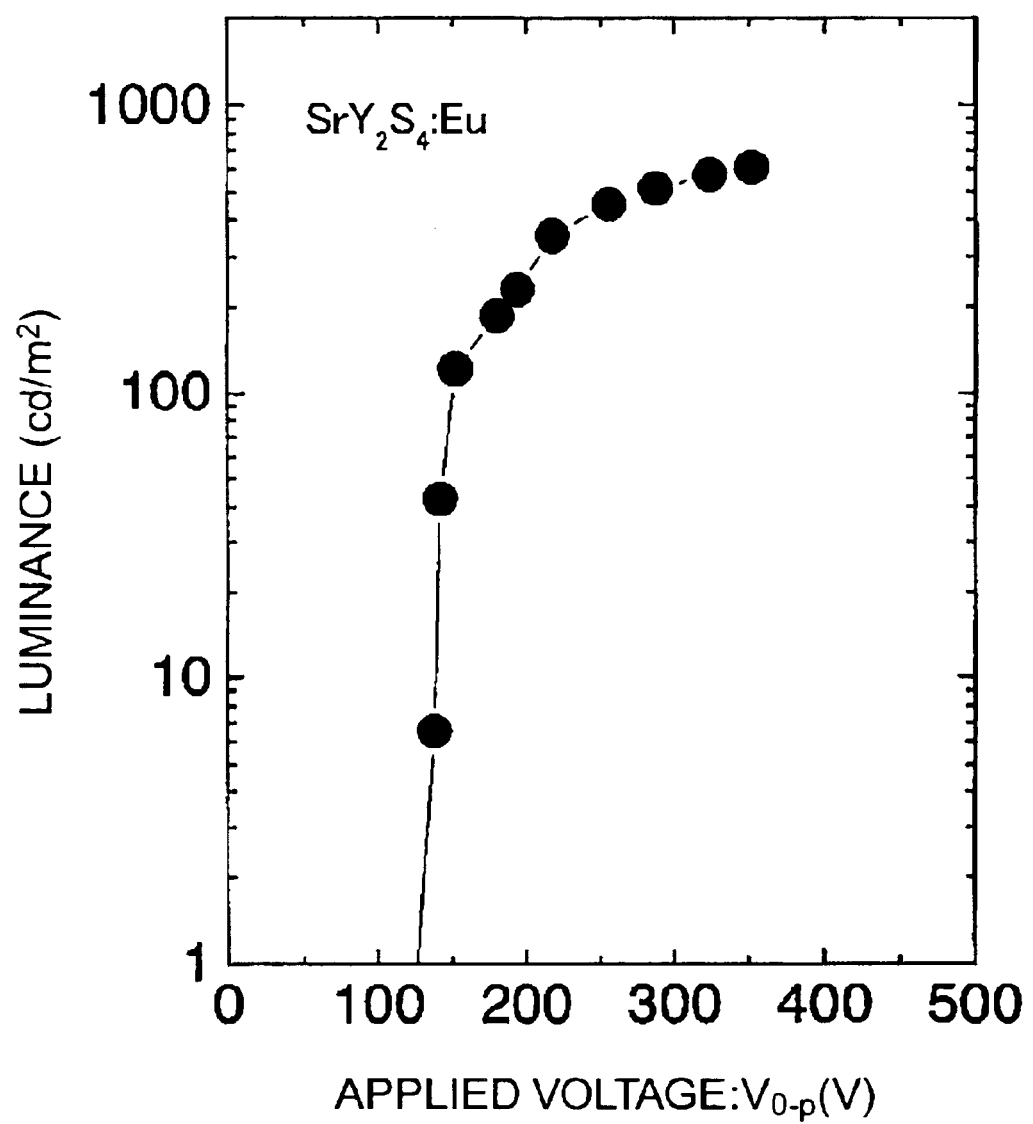
FIG. 7 is a graph showing a voltage—luminance characteristics of the EL panel of Example 2 applying $Sr_1Y_2S_4$:Eu.

Moreover, from the results of the PL spectra, it is apparent that high-luminance red light emission with excellent color purity was obtained particularly from $Sr_1Y_2S_4$:Eu, and that high-luminance blue light emission was obtained from $Ba_1Y_2S_4$:Mn. FIG. 7 shows a voltage—luminance characteristic of $Sr_1Y_2S_4$:Eu.

Furthermore, high-luminance green light emission with excellent color purity was obtained from $ZnY_2S_4$:Mn.

The PL spectrum of the $Ca_1Y_2S_4$:Eu EL panel obtained in Example 1 is also shown in FIG. 5, and the luminescence peak wavelength and the chromaticity coordinates of the EL panel of Example 1 obtained from this PL spectrum are also shown in Table 1, respectively.

In this way, it was confirmed that the phosphor thin film, in which the substance functioning as the luminescence center was added to complex sulfide containing sulfide of alkaline-earth metals (Ca, Ba, Sr, and Mg) and Zn and sulfide of yttrium, emitted high-luminance light in comparison with conventional phosphors. Here, it is analogized that similar effects are obtained if any other rare-earth metal having similar properties to yttrium is added to the complex compound instead of yttrium.

Example 3

An EL panel was fabricated as similar to Example 1 except that the material for the phosphor thin film was changed from $Ca_1Y_2S_4$:Eu to a $Ca_1Y_2O_2S_2$:Eu phosphor.

Figure 8:
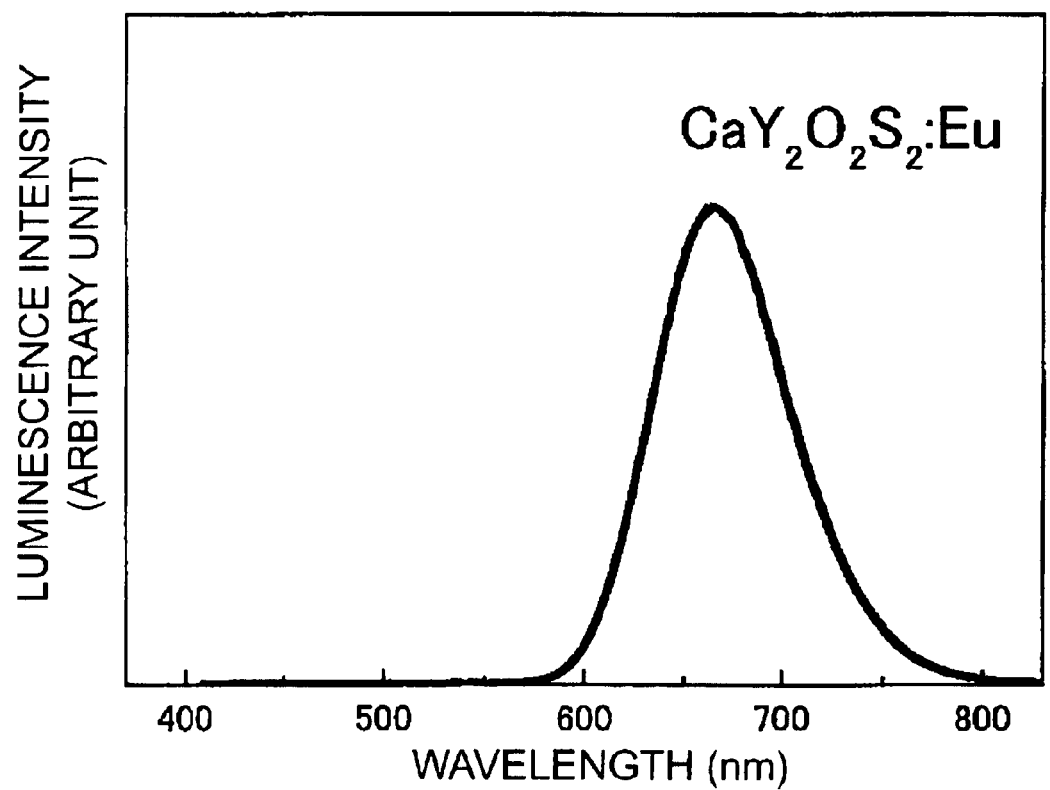
FIG. 8 is a graph showing a luminescence emission spectrum of an EL panel of Example 3.

To be more precise, the phosphor thin film was formed by a vapor deposition method using a target containing CaS, $Y_2S_3$, $Y_2O_3$, and $Eu_2S_3$. FIG. 8 shows a luminescence spectrum of this EL panel. This phosphor also exerted luminance and response similar to Example 1.

Example 4

An EL panel (an EL element) including a thick-film insulating layer was fabricated by use of the phosphor thin film of Example 1. A $BaTiO_3$ dielectric material (dielectric constant $\epsilon$:5000) was used for the substrate and the thick-film insulating layer, and Pd electrodes were used for lower electrodes.

First, a substrate sheet was fabricated. Then, lower electrodes and the thick-film insulating layer are screen-printed thereon to form a green sheet, and the green sheet was baked at the same time. A surface of the obtained complex substrate was polished to be formed into the substrate including the thick-film insulating layer of a thickness of 30 $\mu$m. Moreover, a $BaTiO_3$ film of the thickness of 400 nm is formed thereon as a barrier layer by the sputtering method. Thereafter, the substrate was annealed in air at 700 C.°.

On this complex substrate, a structure of "$Al_2O_3$ film (50 nm)/EL thin film/$Al_2O_3$ film (50 nm)" was fabricated so as to allow the EL panel to emit light stably. The EL thin film was formed into a structure of "ZnS film (200 nm)/phosphor thin film (300 nm)/ZnS film (200 nm)".

Upon fabrication of the phosphor thin film, a $Ca_1Y_2S_4$:Eu thin film was fabricated as similar to Example 1.

A laminated material thus obtained was structured into a structure of "$Al_2O_3$ film (50 nm)/ZnS film (200 nm)/phosphor thin film (300 nm)/ZnS film (200 nm)/$Al_2O_3$ film (50 nm)". Then, the laminated material was annealed in air at 700 C.° for 10 minutes.

Moreover, an ITO transparent electrode of a film thickness of 200 nm was formed on the obtained laminated material at a substrate temperature of 250 C.° by the RF magnetron sputtering method using an ITO oxide target, and the EL panel was finished.

An electric field at a frequency of 1 kHz and a pulse width of 50 $\mu$S was applied between two electrodes of the obtained EL panel. As a result, red light emission luminance at 500 cd/m$^2$ and at a chromaticity of (0.67, 0.33) according to the CIE 1931 color matching function was obtained. In this EL element, response was improved to 20 ms or less as compared to several seconds to several tens of seconds in a conventional example. It is apparent that the EL element of this example exerts higher luminance as compared to 80 cd/M$^2$ which was observed in the EL panel of Comparative Example 1 using the conventional red material CaS:Eu.

As it is clear from the above-described examples, the EL panel including the phosphor thin film of the present invention emits high-luminance light.

The EL panel using the above-described phosphor thin film can achieve a multicolor EL panel or a full-color EL panel with higher luminance. Therefore, the present invention has significant practical advantages.

What is claimed is:

1. A phosphor thin film on a support comprising:
    a matrix material expressed by a composition formula $A_xB_yO_wS_z$,
    A representing at least one element selected from the group consisting of Mg; Ca, Sr, Ba, and Zn,
    B representing at least one element selected from the group consisting of Sc, Y, La, Ce, Pr, Nd, Pm, Sm, Eu, Gd, Tb, Dy, Ho, Er, Tm, Yb, and Lu,
    molar ratios being respectively set as 0<x<5, 0<y<4, 0≦z<8, and 0≦w<8, and
    0=z=w never holding true, and
    a substance functioning as a luminescence center in the matrix material,
    wherein the matrix material satisfies 0.001<w/(z+w)<0.6.
2. The phosphor thin film according to claim 1,
    wherein the substance functioning as the luminescence center is any of Mn and a Mn compound.
3. The phosphor thin film according to claim 1,
    wherein the substance functioning as the luminescence center is any of Eu and a Eu compound.

4. The phosphor thin film according to claim 1, wherein the substance functioning as the luminescence center is any of Ce and a Ce compound.

5. An electroluminescence panel comprising:
the phosphor thin film according to claim 1.

6. A method of manufacturing a phosphor thin film comprising:

forming a thin film by vapor deposition using a single vapor source including at least one element selected from the group consisting of Mg, Ca, Sr, Ba, and Zn, any of an oxide and a sulfide of at least one element selected from the group consisting of Sc, Y, La, Ce, Pr, Nd, Pm, Sm, Eu, Gd, Tb, Dy, Ho, Er, Tm, Yb, and Lu, and a substrate functioning as a luminescence center; and annealing the formed thin film to form the phosphor thin film, wherein the phosphor thin film has a formula $A_xB_yO_wS_z$, A representing at least one element selected from the group consisting of Mg, Ca, Sr, Ba and Zn, B representing at least one element selected from the group consisting of Sc, Y, La, Ce, Pr, Nd, Pm, Sm, Eu, Gd, Tb, Dy, Ho, Er, Tm, Yb, and Lu, molar ratios being respectively set as $0<x\ 5$, $0<y<4$, $0\leq z<8$, and $0\leq w\leq 8$, and $0=z=w$ never holding true.

* * * * *